United States Patent
Nomura et al.

(10) Patent No.: US 10,167,573 B2
(45) Date of Patent: Jan. 1, 2019

(54) METHOD OF PRODUCING SIC SINGLE CRYSTAL

(75) Inventors: Tadao Nomura, Echizen (JP); Norio Yamagata, Echizen (JP); Takehisa Minowa, Echizen (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 900 days.

(21) Appl. No.: 13/300,911

(22) Filed: Nov. 21, 2011

(65) Prior Publication Data

US 2012/0132130 A1 May 31, 2012

(30) Foreign Application Priority Data

Nov. 26, 2010 (JP) .................. 2010-263930
Nov. 26, 2010 (JP) .................. 2010-263950

(51) Int. Cl.
| | |
|---|---|
| *H01L 21/30* | (2006.01) |
| *C30B 29/36* | (2006.01) |
| *C30B 9/10* | (2006.01) |
| *C30B 11/04* | (2006.01) |

(52) U.S. Cl.
CPC .............. *C30B 29/36* (2013.01); *C30B 9/10* (2013.01); *C30B 11/04* (2013.01)

(58) Field of Classification Search
CPC ............ C30B 11/04; C30B 29/36; C30B 9/10
See application file for complete search history.

(56) References Cited

U.S. PATENT DOCUMENTS

| | | | | |
|---|---|---|---|---|
| 3,053,635 | A | * | 9/1962 | Shockley .................. C30B 9/00 |
| | | | | 117/19 |
| 5,367,981 | A | * | 11/1994 | Maruyama .................... 117/200 |
| 5,454,346 | A | | 10/1995 | Uchida et al. |
| 7,520,930 | B2 | | 4/2009 | Kusunoki et al. |

(Continued)

FOREIGN PATENT DOCUMENTS

| | | |
|---|---|---|
| DE | 3644746 A1 | 7/1988 |
| JP | 61-236681 A | 10/1986 |

(Continued)

OTHER PUBLICATIONS

Dmitriev, V.A. et al.; "Silicon carbide and SiC—AlN solid-solution p-n structures grown by liquid-phase epitaxy"; Physica B. Condensed Matter, Amsterdam, NL, vol. 185, No. 1-4, Apr. 1, 1993 (Apr. 1, 1993), pp. 440-452.(cited in European Search Report dated Feb. 27, 2012).

(Continued)

*Primary Examiner* — Hua Qi
(74) *Attorney, Agent, or Firm* — Westerman, Hattori, Daniels & Adrian, LLP

(57) ABSTRACT

A method of producing a SiC single crystal includes: disposing a SiC seed crystal at a bottom part inside a graphite crucible; causing a solution containing Si, C and R (R is at least one selected from the rare earth elements inclusive of Sc and Y) or X (X is at least one selected from the group consisting of Al, Ge, Sn, and transition metals exclusive of Sc and Y) to be present in the crucible; supercooling the solution so as to cause the SiC single crystal to grow on the seed crystal; and adding powdery or granular Si and/or SiC raw material to the solution from above the graphite crucible while keeping the growth of the SiC single crystal.

30 Claims, 2 Drawing Sheets

(56) References Cited

U.S. PATENT DOCUMENTS

| | | | |
|---|---|---|---|
| 7,588,636 | B2 | 9/2009 | Nakamura |
| 7,635,413 | B2 | 12/2009 | Kusunoki et al. |
| 2003/0217689 | A1* | 11/2003 | Asami .................. C30B 11/00 117/81 |
| 2005/0183657 | A1 | 8/2005 | Kusunoki et al. |
| 2009/0178610 | A1 | 7/2009 | Sakamoto et al. |
| 2010/0288187 | A1* | 11/2010 | Terashima ............ C30B 17/00 117/73 |

FOREIGN PATENT DOCUMENTS

| | | | |
|---|---|---|---|
| JP | 2000-264790 | A | 9/2000 |
| JP | 2004-002173 | A | 1/2004 |
| JP | 2005-154190 | A | 6/2005 |
| JP | 2005-350324 | A | 12/2005 |
| JP | 2005350324 | A * | 12/2005 |
| JP | 2006-143555 | A | 6/2006 |
| JP | 2006-321681 | A | 11/2006 |
| JP | 2006321681 | A * | 11/2006 |
| JP | 2007-076986 | A | 3/2007 |
| JP | 2007-277049 | A | 10/2007 |
| JP | 2009-167045 | A | 7/2009 |

OTHER PUBLICATIONS

European Search Report dated Feb. 27, 2012, issued in corresponding European Patent Application No. 11190766.

Hofmann, Dieter H. et al.; "Prospects of the use of liquid phase techniques for the growth of bulk silicon carbide crystals"; Materials Science and Engineering B, Elsevier Sequoia, Lausanne, CH, vol. 61-62, Jul. 30, 1999 (Jul. 30, 1999), pp. 29-39.(cited in European Search Report dated Feb. 27, 2012).

Tairov and Y A Vodakove Y M Ed—Edited by J I Pankov: "2. Group IV Materials (Mainly SiC)", Jan. 1, 1977 (Jan. 1, 1977), Electroluminescence / ED. By J. I. Pankove, Berlin [ U. A.] : Springer, 1977, DE, pp. 2961.(cited in European Search Report dated Feb. 27, 2012).

Syvajari M. et al.; "Growth of 4H-SiC from liquid phase"; Materials Science and Engineering B, Elsevier Sequoia, Lausanne, CH, vol. 46, No. 1-3, Apr. 1, 1997 (Apr. 1, 1997), pp. 329-332.(cited in European Search Report dated Feb. 27, 2012).

Yakimova, R et al.; "Silicon carbide liquid phase epitaxy in the Si—Sc—C system"; Institute of Physics Conference Series; vol. 142], Bristol [U.A.] : Institute, vol. 142, Sep. 18, 1995 (Sep. 18, 1995), pp. 101-104.(cited in European Search Report dated Feb. 27, 2012).

* cited by examiner

METHOD OF PRODUCING SIC SINGLE CRYSTAL

CROSS-REFERENCE TO RELATED APPLICATION

This non-provisional application claims priority under 35 U.S.C. § 119(a) on Patent Application Nos. 2010-263930 and 2010-263950 filed in Japan on Nov. 26, 2010 and Nov. 26, 2010, respectively, the entire contents of which are hereby incorporated by reference.

TECHNICAL FIELD

The present invention relates to a method of producing a SiC (silicon carbide) single crystal according to the solution method.

BACKGROUND ART

SiC has excellent characteristics with respect to band gap, dielectric breakdown voltage, electron saturation rate, thermal conductivity and the like. Therefore, SiC has come to be expected as a material for next-generation power devices and high-temperature devices which surpasses the limits of Si, and, attendant on this, developments of substrate materials have been conducted vigorously.

As a method for growth of SiC single crystals, there have been known the sublimation method, the CVD method, the Acheson method, the solution method and the like.

The Acheson method is a method which has long been practiced industrially, wherein silicic anhydride and carbon are heated at a high temperature to cause precipitation of a SiC single crystal. By this method, however, it is difficult to produce a single crystal with high purity. The sublimation method is a method wherein a SiC raw material powder is heated to a temperature of 2,200 to 2,400° C. to be once converted into gas of Si, $Si_2C$, $SiC_2$, or the like, and the gas is again precipitated as SiC on a seed crystal at a low temperature. This method is presently the mainstream method for production of SiC bulk single crystals. Since the sublimation method is a vapor phase growth method, however, there is a problem that various defects are liable to be generated in the crystal obtained. Besides, in the CVD method, it is difficult to produce a bulk single crystal, since the raw materials are gaseous components.

The solution method is a method wherein Si or a Si-containing alloy is melted in a graphite crucible, and, further, carbon is eluted also from the graphite crucible, whereby a SiC single crystal is grown through precipitation from the solution containing Si and C onto a seed crystal disposed in a low-temperature zone. In general, the use of a Si melt alone makes it difficult for C to be sufficiently dissolved on a solid solution basis. Therefore, there is adopted a technique for enhancing the solubility of C by using a solution which contains a third element. According to the solution method, it is possible to obtain a single crystal with higher quality having fewer defects, as compared with the case of the sublimation method. On the other hand, however, by the solution method it is difficult to obtain a growth rate as high as that in the sublimation method. In view of this, various investigations have been made on the method of producing a SiC single crystal according to the solution method.

Patent Document 1 (JP-A 2000-264790) discloses a method of growing a SiC single crystal through precipitation by the use of a melt containing Si, C and a transition metal. Besides, a SiC single crystal is grown by the use of a melt of Si—C—M (M is Mn or Ti) in Patent Document 2 (JP-A 2004-002173), a melt of Si—C—M (M is Fe or Co) in Patent Document 3 (JP-A 2006-143555), or a melt of Si—C—Ti—M (M is Co or Mn) in Patent Document 4 (JP-A 2007-076986).

Patent Document 5 (JP-A 2006-321681) discloses a method of growing a SiC single crystal of a desired crystal structure selected from among 15R, 3C and 6H structures, by using a melt obtained by melting raw materials including Si and C and a third element or a compound thereof. As the third element, borides, Sn (15R), Gd (3C), and Al, Dy and La (6H) are mentioned in this document. Patent Document 6 (JP-A 2007-277049) describes the use of a melt obtained by adding a rare earth element and any of Sn, Al and Ge to Si. Here, the addition of the rare earth element is effective in enhancing the solubility of C in the Si melt and thereby enhancing the growth rate of the SiC single crystal. Under the conditions where the growth rate is high, however, turning into a polynuclear state or polycrystalline state is liable to occur at the growth surface. In view of this, the document shows a technique of stably securing even growth by adding Sn, Al or Ge as an element for uniformly activating the growth surface. Patent Document 7 (JP-A 2009-167045) describes the use of a melt of Si—Cr—X (X is Ce or Nd), and shows that simultaneous addition of Cr and X makes it possible to reduce the number of macroscopic defects generated in the SIC single crystal. In addition, Patent Documents 8 and 9 (JP-A 2005-154190 and JP-A 2005-350324) show methods for growing a SiC single crystal, wherein a SiC raw material rod, a solvent, and a seed crystal are stacked sequentially from the lower side, and a temperature gradient is formed at upper and lower end surfaces of the solvent. In this case, use is made of a solvent including Si and an element selected from the group consisting of Y, lanthanoid, the Group I elements, the Group II elements, the Group IIIB elements, and the like.

When a solution containing a rare earth element is used, the solubility of C can be enhanced and the growth rate, which relates to one of the problems encountered in the solution method, is enhanced. When the solubility of C is enhanced, however, there arises a problem that roughening or turning to a polycrystalline state is liable to occur at the growth surface, lowering the quality of the SiC single crystal. For coping with this problem, the addition of an element for suppressing the solubility of C, simultaneously with the addition of the rare earth element, has been tried. However, this approach is disadvantageous in that since the solution becomes a multicomponent system containing furthermore components, it is difficult to control the composition of the solution, and the manner of crystal growth is liable to be influenced by subtle variations in the crystal growth conditions. Further, as the SiC single crystal grows from the solution, Si and C among the components of the solution are consumed and the composition of the solution is thereby changed, so that the optimum conditions for crystal growth are largely varied with time. Therefore, according to the solution method, it is difficult to produce a SiC single crystal which is long and large in diametral size. Patent Documents 8 and 9 (JP-A 2005-154190 and JP-A 2005-350324) disclose a method in which raw material is supplied from a SiC raw material rod. In this case, the composition of the solvent is not largely fluctuated, but the SiC raw material rod has to be preliminarily prepared, which leads to a raised production cost.

In addition, Patent Document 8 discloses a method of producing a silicon carbide single crystal wherein the composition of solvent includes Si and at least one coexistent element selected from the group consisting of Y, Sc, lanthanoid, the Group I elements, and the Group II elements of the Periodic Table. Patent Document 9 discloses a method of producing a SiC single crystal wherein the composition of solvent includes Si, Y and at least one element selected from the Group IIIB elements of the Periodic Table. In these cases, the solvent composition is not largely fluctuated, but the SiC raw material rod has to be preliminarily prepared, which leads to a higher production cost.

SUMMARY OF THE INVENTION

The present invention has been made in consideration of the above-mentioned problems in the related art. Accordingly, it is an object of the present invention to provide a method of producing a SiC single crystal by which a SiC single crystal being long and large in diametral size and having less defects such as turning into a polycrystalline state can be obtained at a high growth rate.

The present inventors made investigations on how to solve the above-mentioned problems. As a result of their investigations, they found out a method wherein a solution containing an element having a carbon solubility-enhancing effect selected from the group consisting of Al, Ge, Sn, the rare earth elements, and the transition metals exclusive of Sc and Y is used, a SiC single crystal is grown, not from the upper surface of the solution where evaporation of solution components or the like is liable to occur and local fluctuations in conditions are severe, but from a bottom portion of the solution where conditions are stable due to the state of being surrounded by a graphite crucible and a more moderate temperature gradient can be set, and powdery or granular Si and/or SiC raw material is added to the solution from above the graphite crucible with appropriate timing, whereby the composition of the solution can be kept substantially constant instead of varying with the lapse of time.

According to embodiments of the present invention, there is provided a method of producing a SiC single crystal as follows.

[1] A method of producing a SiC single crystal includes: disposing a SiC seed crystal at a bottom part inside a graphite crucible; causing a solution containing Si, C and R to be present in the graphite crucible, R being at least one selected from the rare earth elements inclusive of Sc and Y; cooling the solution so as to cause the SiC single crystal to grow on the seed crystal; and adding powdery or granular Si and/or SiC raw material to the solution from above the graphite crucible while keeping the growth of the SiC single crystal.

[2] In the method of producing the SiC single crystal according to the above paragraph [1], the amount of the powdery or granular Si and/or SiC raw material added to the solution is so controlled that the weight ratio $[W_R/(W_{Si}+W_R)]$ of R to the sum of the weight $W_{Si}$ of Si and the weight $W_R$ of R in the solution during growth of the SiC single crystal is within the range of 0.05 to 0.75.

[3] In the method of producing the SiC single crystal according to the above paragraph [1] or [2], the amount of the powdery or granular Si and/or SiC raw material added to the solution is so controlled that the difference between the weight ratio of R in the solution during growth of the SiC single crystal and the weight ratio of R in the composition of the raw material of the solution initially loaded in the graphite crucible does not exceed ±0.1.

[4] In the method of producing the SiC single crystal according to any one of the above paragraphs [1] to [3], R is at least one selected from the group consisting of La, Ce, Pr, Nd, Gd, and Dy.

[5] In the method of producing the SiC single crystal according to any one of the above paragraphs [1] to [4], a vacuum or an inert gas atmosphere is kept inside a furnace in which the graphite crucible is disposed, a temperature gradient zone in which temperature is continuously lowered toward the lower side is provided inside the furnace, and the graphite crucible is lowered within the temperature gradient zone so as to cause the SiC single crystal to grow on the seed crystal.

[6] A method of producing a SiC single crystal includes: disposing a SiC seed crystal at a bottom part inside a graphite crucible; causing a solution containing Si, C and X to be present in the graphite crucible, X being at least one selected from the group consisting of Al, Ge, Sn, and transition metals exclusive of Sc and Y; cooling the solution so as to cause the SiC single crystal to grow on the seed crystal; and adding powdery or granular Si and/or SiC raw material to the solution from above the graphite crucible while keeping the growth of the SiC single crystal.

[7] In the method of producing the SiC single crystal according to the above paragraph [6], the amount of the powdery or granular Si and/or SiC raw material added to the solution is so controlled that the weight ratio $[W_X/(W_{Si}+W_X)]$ of X to the sum of the weight $W_{Si}$ of Si and the weight $W_X$ of X in the solution during growth of the SiC single crystal is within the range of 0.01 to 0.75.

[8] In the method of producing the SiC single crystal according to the above paragraph [6] or [7], the amount of the powdery or granular Si and/or SiC raw material added to the solution is so controlled that the difference between the weight ratio of X in the solution during growth of the SiC single crystal and the weight ratio of X in the composition of the raw material of the solution initially loaded in the graphite crucible does not exceed ±0.1.

[9] In the method of producing the SiC single crystal according to any one of the above paragraphs [6] to [8], X is at least one selected from the group consisting of Ti, V, Cr, Mn, Fe, Co, Ni, Cu, Zn, Al, Ge, and Sn.

[10] In the method of producing the SiC single crystal according to any one of the above paragraphs [6] to [9], a vacuum or an inert gas atmosphere is kept inside a furnace in which the graphite crucible is disposed, a temperature gradient zone in which temperature is continuously lowered toward the lower side is provided inside the furnace, and the graphite crucible is lowered within the temperature gradient zone so as to cause the SiC single crystal to grow on the seed crystal.

ADVANTAGEOUS EFFECT OF THE INVENTION

According to the method of producing the SiC single crystal according to the present invention, it is possible to enhance the solubility of C in the solution, thereby to enhance the growth rate of the SiC single crystal, to suppress fluctuations in the composition of the solution due, for example, to consumption of SiC components attendant on the growth of the single crystal, and to stabilize the conditions for single crystal growth.

DESCRIPTION OF EMBODIMENTS

Figure 1:
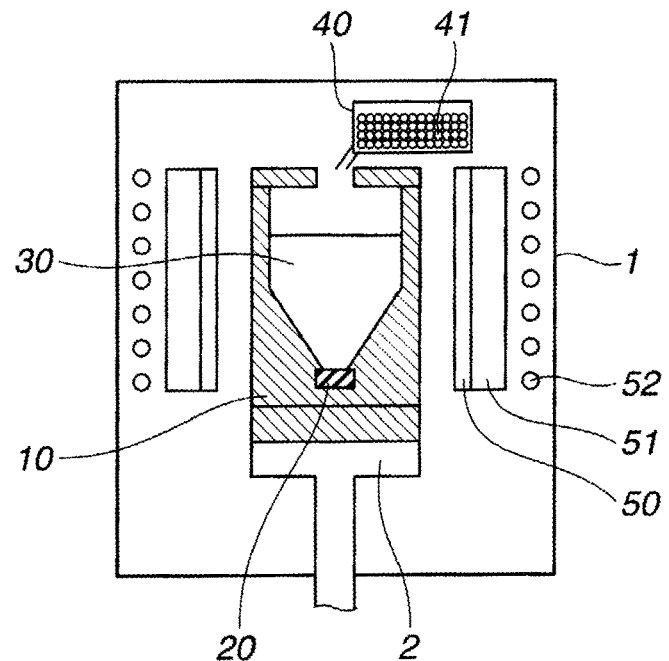
FIG. 1 schematically illustrates an example of a SiC single crystal producing apparatus suitable for carrying out the method according to the present invention.
Figure 2:
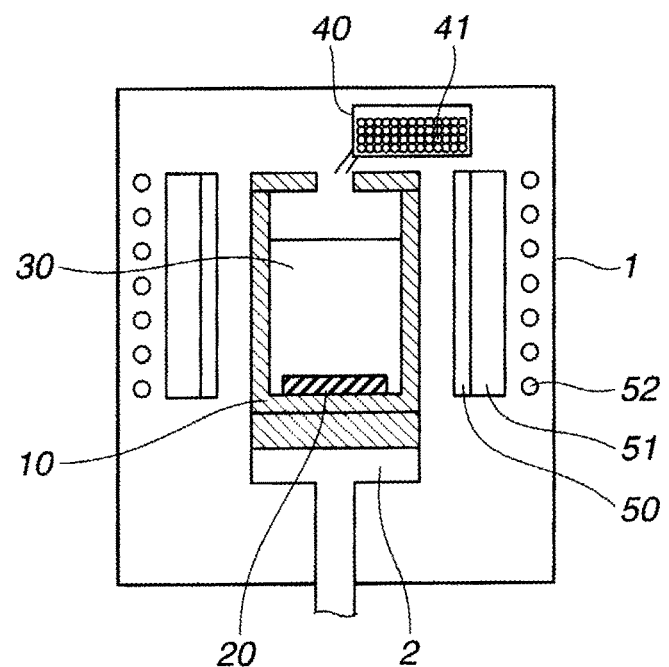
FIG. 2 schematically illustrates another example of the SiC single crystal producing apparatus suitable for carrying out the method according to the present invention.

FIGS. 1 and 2 illustrate examples of the apparatus for carrying out the method according to the present invention. In each of the drawings, reference symbol 1 denotes a furnace, and a vacuum or an inert gas atmosphere is kept inside the furnace 1. A graphite crucible 10 is disposed inside the furnace 1. The graphite crucible 10 is formed in the shape of a hollow cylinder opened at the upper end thereof and closed at the lower end thereof, and is placed on a support 2 arranged to be movable in the vertical direction. As the support 2 is lowered, the graphite crucible 10 is also lowered attendantly. Here, the graphite crucible 10 in FIG. 1 has an internal wall which is formed in a funnel-like shape gradually slanted down from an intermediate portion thereof toward a lower portion thereof, and a SiC seed crystal 20 is disposed in a central area of a bottom part of the graphite crucible 10. On the other hand, the graphite crucible 10 in FIG. 2 has an internal wall formed in a hollow cylindrical shape, and a SiC seed crystal 20 is disposed in a central area of a bottom surface of the graphite crucible 10. In this condition, a solution 30 containing Si and C as well as R or X is caused to present inside the graphite crucible 10. In addition, a raw material loading container 40 is disposed on the upper side of the inside of the graphite crucible 10, and a loading (additional loading) 41 (Si and/or SiC raw material) is additionally loaded from the raw material loading container 40 into the solution 30 through an upper end opening of the graphite crucible 10. Incidentally, reference symbol 50 in the figure denotes a susceptor, 51 a heat insulating material, and 52 an induction coil.

In the present invention, the SiC seed crystal is disposed at a bottom part inside the graphite crucible, and, further, raw materials to be a solution are loaded in the crucible (initial loading). The solution contains Si and C as well as R (R is at least one selected from the rare earth elements inclusive of Sc and Y) or X (X is at least one selected from Al, Ge, Sn and the transition elements exclusive of Sc and Y). Therefore, Si and R metal or X metal or its compound, alloy or the like are preferably used as the raw materials. As a source material of C, there may be used SiC, an R carbide, an X carbide or the like, or elution of C from the graphite crucible into the solution may be utilized.

In order to enhance the solubility of C into the solution, R (R is at least one selected from the rare earth elements inclusive of Sc and Y) or X (X is at least one selected from the group consisting of Al, Ge, Sn and the transition metals exclusive of Sc and Y) is selected as a third element. It is preferable from the viewpoint of raw material cost that R is at least one selected from the group consisting of La, Ce, Pr, Nd, Gd and Dy, or that X is at least one selected from the group consisting of Ti, V, Cr, Mn, Fe, Co, Ni, Cu, Zn, Al, Ge and Sn. Each of the source materials of R and X used here may be an elemental metal or a compound thereof.

In this case, the ratio of the amounts of Si and C and R to be used is appropriately selected, and it is preferable that the weight ratio $[W_R/(W_{Si}+W_R)]$ of R in the solution is kept within the range of from 0.05 to 0.75 during the growth of the SiC single crystal. If the weight ratio is less than 0.05, the solubility of C into the solution is so low that a sufficient growth rate of the SiC single crystal cannot be obtained. If the weight ratio is in excess of 0.75, on the other hand, the formation of polycrystalline SiC may be liable to occur, making it difficult to grow the single crystal. The weight ratio of R is more preferably in the range from 0.1 to 0.7, and further preferably in the range from 0.15 to 0.6.

It is preferable that the concentration of C in the solution is as high as possible. If the C concentration is too high, however, undissolved SiC and C would be present in the solution, adversely affecting the growth of the single crystal. Therefore, the C concentration is preferably set in such a range as to prevent the presence of undissolved SiC or C. The optimum amount of C is heavily dependent on the weight ratio of R/(Si+R) and the solution temperature.

Preferably, the weight ratio of C based on the whole part of the solution is controlled to within the range of 0.1 to 15% by weight, particularly within the range of 1 to 10% by weight. If necessary, a fourth element Z selected from the group consisting of Ti, V, Cr, Mn, Fe, Co, Ni, Cu, Zn, Ge, Al, Zr, Nb, Mo, Hf, Ta, W and the like may further be added, in addition to R. In this case, the amount of Z to be added is preferably not more than 0.5 times the amount of R, by weight.

The proportions of Si and C and X used are appropriately selected. Preferably, the weight ratio $[W_X/(W_{Si}+W_X)]$ in the solution is kept in the range of from 0.01 to 0.75 during the growth of the SiC single crystal. If the weight ratio is less than 0.01, the solubility of C into the solution is so low that a sufficient growth rate of the SiC single crystal cannot be obtained. If the weight ratio exceeds 0.75, on the other hand, formation of polycrystalline SiC may be liable to occur, making it difficult to grow the single crystal. The weight ratio of X is more preferably in the range from 0.05 to 0.7, and further preferably in the range from 0.1 to 0.6.

As above-mentioned, it is preferable that the concentration of C in the solution is as high as possible. If the C concentration is too high, however, undissolved SiC and C would be present in the solution, adversely affecting the growth of the single crystal. Therefore, the C concentration is preferably set in such a range as to prevent the presence of undissolved SiC and C. The optimum amount of C is heavily dependent on the weight ratio of X/(Si+X) and the solution temperature. Preferably, the weight ratio of C based on the whole part of the solution is controlled to within the range of 0.1 to 15% by weight, particularly within the range of 1 to 10% by weight. If necessary, a fourth element Y selected from the group consisting of Ga, In, As, Sb and the like may further be added, in addition to X. In this case, the amount of Y to be added is preferably not more than 0.5 times the amount of X, by weight.

After the graphite crucible loaded with the seed crystal and the solution raw materials are disposed inside the furnace, a vacuum or an inert gas atmosphere such as Ar atmosphere is established inside the furnace, and the raw materials in the crucible are melted by heating with a heater. The heater may be a system obtained by combining an induction coil with a susceptor, or may be a resistance heating system. In the inside of the apparatus, there is formed a temperature gradient zone where temperature is continuously lowered along a downward direction. After a predetermined temperature is reached inside the crucible, the crucible is gradually lowered so as to pass through the temperature gradient zone. In this instance, the solution temperature inside the crucible is slowly lowered starting from the bottom part, attended by a lowering in the solubility of C in the solution. Therefore, when a supersaturated state is reached in the vicinity of the seed crystal disposed in the bottom part of the crucible, the SiC single crystal grows on the seed crystal, with the degree of supersaturation as a driving force.

The temperature of the raw materials inside the crucible is preferably 1,400 to 2,200° C., particularly 1,600 to 2,100° C. In addition, the temperature inside the furnace is preferably set to be continuously lowered along the downward direction so as to provide a temperature gradient of 5 to 100° C./cm, particularly 10 to 50° C./cm.

The lowering of the crucible is preferably carried out at a rate of 10 to 1,000 μm/hr, particularly 50 to 500 μm/hr.

When R or X is used as the third element, the solubility of C in the solution can be enhanced, but, in general, turning to a polynuclear state or polycrystalline state is liable to occur in the SiC single crystal. In order to restrain such a phenomenon, the growth of the SiC single crystal is effected not in an upper portion near the free surface of the solution but in a lower portion of the solution where the conditions are stable. This ensures that local condition fluctuations such as evaporation of components from the solution surface or vibrations are not liable to occur, and the temperature gradient can be made uniform over the whole part of the growth surface. Consequently, a gentle temperature gradient can be set, precipitation of SiC can be made to take place slowly, and turning to a polycrystalline state can be restrained.

As the lowering of the crucible is continued, the SiC single crystal gradually grows further, while taking in Si and C from within the solution. Attendant on this, the amount of Si in the solution gradually decreases from the amount in the initial solution composition, so that the solution composition gradually varies to a composition containing a relatively larger amount of R or X. Besides, such factors as evaporation of the Si component from the free surface of the solution are also the cause of fluctuations in composition. When the solution composition is shifted toward the R- or X-rich phase, the conditions for precipitation of the SiC phase from the solution are also varied gradually. Therefore, the conditions suitable for growth of the SiC single crystal are changed little by little with the lapse of time during the crucible-lowering process. Consequently, the SiC single crystal having been growing satisfactorily in the beginning period may come to show formation of polycrystalline SiC or to suffer generation of various defects, starting from a certain time point in the course of crystal growth.

On the other hand, when raw material corresponding to the variations in the composition of the solution is added while continuing the growth of the SiC single crystal, the solution can be kept within a certain range of composition. The raw material is additionally loaded into the solution from above the graphite crucible. If the additional raw material is loaded from above the solution surface in the same manner as just-mentioned in a method wherein a seed crystal is immersed in an upper portion of the solution and then pulled upward, disturbances in the vicinity of the solution surface and local fluctuations in composition at the time of additional loading of the raw material would largely affect the precipitation of SiC, because the SiC single crystal is growing just beside the raw material loading position. In the present invention, on the other hand, the growth of the SiC single crystal is caused to take place at a lower portion of the solution whereas the additional loading of raw material is conducted at an upper portion of the solution remote from the crystal growth region, whereby the raw material adding operation can be prevented from imposing a bad influence on the growth of the SiC single crystal.

As the raw material, powdery or granular Si, which is easy to load, is used. In the case where the prevailing conditions are such that the concentration of C in the solution decreases with the lapse of time, powdery or granular SiC is added simultaneously with the addition of Si. The amount of the raw material(s) to be added may be calculated by a method in which an experiment without addition of the raw material is preliminarily carried out, the composition of the residue of the solution after solidification by cooling is analyzed, thereby grasping the variation in the composition of the solution, and the addition amount is calculated from the relationship between the operating time and the variation in the composition.

Figure 3:
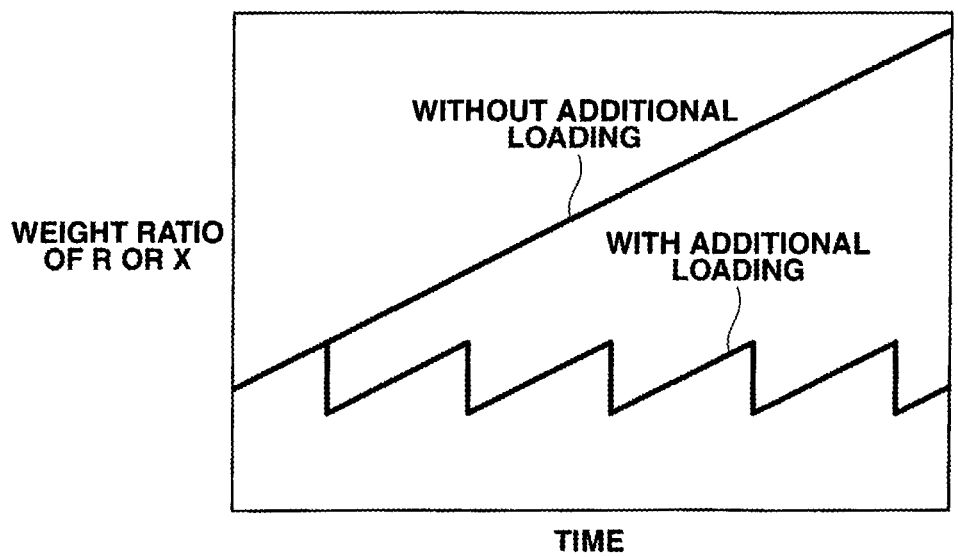
FIG. 3 schematically illustrates time variation in the weight ratio of R or X.

The addition of the raw material may be performed in a continuous manner. Or, alternatively, the raw material may be loaded intermittently in a fixed amount within such a range that the composition of the solution will not be largely deviated from the initial composition. The variation in the solution composition in the case of intermittent addition of the raw material is schematically shown in FIG. 3. Here, let the proportion of the weight $W_R$ of R based on the total of the weight $W_{Si}$ of Si and the weight $W_R$ of R be the weight ratio $[W_R/(W_{Si}+W_R)]$, then the difference between the weight ratio $[W_R/(W_{Si}+W_R)]$ of R based on the total of Si and R in the solution and the weight ratio of R based on the whole part of the raw materials of the solution initially loaded in the graphite crucible is preferably not more than 0.1, more preferably not more than 0.05, and further preferably not more than 0.03. Besides, let the proportion of the weight $W_X$ of X based on the total of the weight $W_{Si}$ of Si and the weight $W_X$ of X be the weight ratio $[W_X/(W_{Si}+W_X)]$, then the difference between the weight ratio $[W_X/(W_{Si}+W_X)]$ of X based on the total of Si and X in the solution and the weight ratio of X based on the whole part of the raw materials of the solution initially loaded in the graphite crucible is preferably not more than 0.1, more preferably not more than 0.05, and further preferably not more than 0.03.

EXAMPLES

Now, the present invention will be described more in detail below, showing Examples and Comparative Examples, but the invention is not to be restricted to the following Examples.

Examples 1 to 6, Comparative Examples 1 and 2

An apparatus as illustrated in FIG. 1 was used, wherein a SiC single crystal was disposed at a bottom part inside a graphite crucible, and raw materials of Si and R were loaded thereon (initial loading) so as to offer a predetermined composition. After an Ar atmosphere was established inside the furnace, temperature was raised to a preset temperature (holding temperature), which was kept for a time of 30 minutes to three hours, and thereafter lowering of the crucible was started.

The lowering of the crucible was continued for 100 hours. During the lowering, a SiC powder and a Si powder were loaded (additional loading) into the solution from above the crucible at a time interval of three to ten hours. The amount of the raw materials to be loaded in the additional manner were calculated from the difference between the analytical result of the composition of the residue in an experimental operation without the additional loading and the composition of the raw materials. In every one of Examples, a favorable SiC single crystal could be obtained. Table 1 below shows the raw materials and the weight ratio of R therein at the initial loading, and the holding temperature, and Table 2 shows the weight ratio of R in the residue of the solution after the lowering of the crucible and the growth rate of the SiC single crystal.

In Comparative Example 1, additional loading of the SiC powder and the Si powder during the lowering of the crucible was not conducted. In this case, the SiC crystal taken out after completion of the lowering of the crucible showed the formation of polycrystalline SiC starting from a time point in the course of crystal growth. In Comparative Example 2, a solution not containing the R element was used. In this case, an extremely low growth rate could only be obtained, and satisfactory crystallinity was not obtainable.

TABLE 1

|   | Initially loaded raw material (weight ratio) | Weight ratio of raw material R $W_R/(W_{si} + W_R)$ | Holding temperature (° C.) |
|---|---|---|---|
| Example 1 | Si:La = 45:55 | 0.55 | 1,610 |
| Example 2 | Si:SiC:NdSi$_2$ = 35:1:64 | 0.46 | 1,840 |
| Example 3 | Si:SiC:Pr = 67.5:0.5:32 | 0.32 | 1,735 |
| Example 4 | Si:SiC:Gd:Dy = 27:5:42:26 | 0.68 | 1,780 |
| Example 5 | Si:CeSi = 92:8 | 0.07 | 2,020 |
| Example 6 | Si:Ce:La:Nd:Pr = 80:10:6:3:1 | 0.20 | 1,910 |
| Comparative Example 1 | Si:Y$_5$Si$_3$ = 85:15 | 0.13 | 1,895 |
| Comparative Example 2 | Si | — | 1,720 |

TABLE 2

|   | Composition of additional loading (weight ratio) | Weight ratio of R: Residue | Weight ratio of R: Residue-Raw material | Growth rate (μm/hrs) | Crystallinity |
|---|---|---|---|---|---|
| Example 1 | Si:SiC = 99:1 | 0.54 | −0.01 | 270 | satisfactory |
| Example 2 | Si | 0.49 | 0.03 | 400 | satisfactory |
| Example 3 | Si:SiC = 99.7:0.3 | 0.33 | 0.01 | 310 | satisfactory |
| Example 4 | Si | 0.64 | −0.04 | 360 | satisfactory |
| Example 5 | Si | 0.11 | 0.02 | 300 | satisfactory |
| Example 6 | Si:SiC = 98:2 | 0.19 | 0.01 | 420 | satisfactory |
| Comparative Example 1 | — | 0.24 | 0.11 | 120 | moderate |
| Comparative Example 2 | Si:SiC = 97:3 | — | — | 5 | not satisfactory |

Examples 7 to 9, Comparative Examples 3 and 4

An apparatus as shown in FIG. 1 was used, wherein a SiC seed crystal was disposed at a bottom part inside a graphite crucible, and raw materials of Si and X were initially loaded thereon so as to offer a predetermined composition. After an Ar atmosphere was established inside the furnace, temperature was raised to a preset temperature, which was maintained for a time of 30 minutes to three hours, and thereafter lowering of the crucible was started.

The lowering of the crucible was continued for 100 hours. During the lowering, a SiC powder and a Si powder were loaded (additional loading) into the solution from above the crucible at a time interval of three to ten hours. The amounts of the raw materials to be loaded in the additional manner were calculated from the difference between the analytical result of the composition of the residue in an experimental operation without the additional loading and the composition of the raw materials. In every one of Examples, a good SiC single crystal was obtainable. Table 3 below shows the raw materials and the weight ratio of X at the initial loading, and the holding temperature, and Table 4 shows the weight ratio of X in the residue of the solution after the lowering of the crucible and the growth rate of the SiC single crystal.

In Comparative Example 3, additional loading of the SiC powder and the Si powder during the lowering of the crucible was not conducted. In this case, the SiC crystal taken out after completion of the lowering of the crucible showed the formation of polycrystalline SiC starting from a time point in the course of crystal growth. In Comparative Example 4, a solution not containing the X element was used. In this case, an extremely low growth rate could only be obtained, and satisfactory crystallinity was not obtainable.

TABLE 3

|   | Initially loaded raw material (weight ratio) | Weight ratio of raw material X $W_x/(W_{si} + W_x)$ | Holding temperature (° C.) |
|---|---|---|---|
| Example 7 | Si:Ti = 80:20 | 0.20 | 1,750 |
| Example 8 | Si:SiC:Cr = 54:1:45 | 0.45 | 1,830 |
| Example 9 | Si:V = 65:35 | 0.35 | 1,920 |
| Comparative Example 3 | Si:Ti = 80:20 | 0.20 | 1,750 |
| Comparative Example 4 | Si | — | 1,720 |

TABLE 4

|   | Composition of additional loading (weight ratio) | Weight ratio of X: Residue | Weight ratio of X: Residue-Raw material | Growth rate (μm/hrs) | Crystallinity |
|---|---|---|---|---|---|
| Example 7 | Si:SiC = 99:1 | 0.21 | 0.01 | 170 | satisfactory |
| Example 8 | Si | 0.42 | −0.03 | 190 | satisfactory |
| Example 9 | Si:SiC = 98:2 | 0.36 | 0.01 | 240 | satisfactory |
| Comparative Example 3 | — | 0.32 | 0.12 | 90 | moderate |
| Comparative Example 4 | Si:SiC = 97:3 | — | — | 5 | not satisfactory |

According to the present invention, even in the long-time crystal growth based on the solution method, fluctuations in solution composition are suppressed and crystal growth conditions are stabilized, and, therefore, a long SiC single crystal with good quality can be produced.

Japanese Patent Application Nos. 2010-263930 and 2010-263950 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method of producing a SiC single crystal, comprising:
    disposing a SiC seed crystal at a bottom part inside a graphite crucible;
    causing a solution containing Si, C and R to be present in the graphite crucible, the R being at least one selected from the group consisting of La, Ce, Pr, Nd, Pm, Sm, Eu, Gd, Tb, Dy, Ho, Er, Tm, Yb, Lu, Sc and Y;

cooling the solution so as to form a temperature gradient zone where temperature continuously falls from a top to a bottom of the solution downwardly and cause the SiC single crystal to grow on the seed crystal; and adding powdery or granular Si or Si and SiC raw material which corresponds to variations in a composition of the solution to the solution from above the graphite crucible so as to keep the solution within a certain range of the composition while keeping the growth of the SiC single crystal, wherein the powdery or granular Si or Si and SiC raw material is added at the top of the solution having a higher temperature than the bottom of the solution, and an amount of the powdery or granular Si or Si and SiC raw material added to the solution is so controlled that a weight ratio $[W_R/(W_{Si}+W_R)]$ of the R to a sum of the weight $W_{Si}$ of Si and the weight $W_R$ of the R in the solution during growth of the SiC single crystal is within a range of 0.55 to 0.75.

2. The method of producing the SiC single crystal according to claim 1, wherein the amount of the powdery or granular Si and/or SiC raw material added to the solution is so controlled that the difference between the weight ratio of the R in the solution during growth of the SiC single crystal and the weight ratio of the R in the composition of the raw material of the solution initially loaded in the graphite crucible does not exceed ±0.1.

3. The method of producing the SiC single crystal according to claim 1, wherein the R is at least one selected from the group consisting of La, Ce, Pr, Nd, Gd, and Dy.

4. The method of producing the SiC single crystal according to claim 1, wherein a vacuum or an inert gas atmosphere is kept inside a furnace in which the graphite crucible is disposed, a temperature gradient zone in which temperature is continuously lowered along a downward direction is provided inside the furnace, and the graphite crucible is lowered within the temperature gradient zone so as to cause the SiC single crystal to grow on the seed crystal.

5. The method of producing the SiC single crystal according to claim 4, wherein the temperature of the raw materials inside the crucible is 1,400 to 2,200° C., the temperature gradient zone is set to be 5 to 100° C./cm, and the lowering of the crucible is carried out at a rate of 10 to 1,000 μm/hr.

6. The method of producing the SiC single crystal according to claim 1, wherein the weight ratio of C based on the whole part of the solution is controlled to within the range of 0.1 to 15% by weight.

7. The method of producing the SiC single crystal according to claim 1, wherein an element Z selected from the group consisting of Ti, V, Cr, Mn, Fe, Co, Ni, Cu, Zn, Ge, Al, Zr, Nb, Mo, Hf, Ta, and W is added in addition to the R, the amount of Z being greater than 0% and not more than 0.5 times the amount of the R by weight. out at a rate of 10 to 1,000 μm/hr.

8. The method of producing a SiC single crystal of claim 1, wherein the R is selected from the group consisting of Ce, Pr, Nd, Pm, Sm, Eu, Tb, Ho, Er, Tm, Yb, Lu, Sc and Y; and an element Z selected from the group consisting of Ti, V, Cr, Mn, Co, Cu, Zn, Ge, Zr, Nb, Mo, Hf, Ta and W is added along with the R.

9. The method of producing a SiC single crystal of claim 1, wherein the R is selected from the group consisting of La, Ce, Pr, Nd, Gd and Dy; and an element Z selected from the group consisting of Ti, V, Cr, Mn, Co, Cu, Zn, Ge, Zr, Nb, Mo, Hf, Ta and W is added along with the R.

10. The method of producing a SiC single crystal of claim 1, wherein the raw material added to the solution is Si.

11. The method of producing a SiC single crystal of claim 1, wherein the raw material added to the solution is Si and SiC, and a weight ratio of Si/SiC is 99.7/0.3 to 98/2.

12. The method of producing a SiC single crystal of claim 1, wherein the solution containing Si, C and the R caused inside the crucible has a temperature of 1,910 to 2,200° C.

13. The method of producing a SiC single crystal of claim 1, wherein the R is at least one selected from the group consisting of Ce, Pr, Nd, Pm, Sm, Eu, Tb, Ho, Er, Tm, Yb, Lu, and Y.

14. A method of producing a SiC single crystal, comprising:

disposing a SiC seed crystal at a bottom part inside a graphite crucible;

causing a solution containing Si, C and R to be present in the graphite crucible, the R being at least one selected from the group consisting of La, Ce, Pr, Nd, Pm, Sm, Eu, Gd, Tb, Dy, Ho, Er, Tm, Yb, Lu, Sc and Y, and the solution caused in the graphite crucible having a temperature of 1,910 to 2,200° C.;

cooling the solution so as to form a temperature gradient zone where temperature is continuously falls from a top to a bottom of the solution downwardly and cause the SiC single crystal to grow on the seed crystal; and adding powdery or granular Si raw material which corresponds to variations in a composition of the solution to the solution from above the graphite crucible so as to keep the solution within a certain range of the composition while keeping the growth of the SiC single crystal, wherein the powdery or granular Si raw material is added at the top of the solution having a higher temperature than the bottom of the solution, and an amount of the powdery or granular Si raw material added to the solution is so controlled that weight ratio $[W_R/(W_{Si}+W_R)]$ of the R to a sum of the weight $W_{Si}$, of Si and the weight $W_R$ of the R in the solution during growth of the SiC single crystal is within a range of 0.05 to 0.75.

15. A method of producing a SiC single crystal, comprising:

disposing a SiC seed crystal at a bottom part inside a graphite crucible;

causing a solution containing Si, C and R to be present in the graphite crucible, the R being at least one selected from the group consisting of Ce, Pr, Nd, Pm, Sm, Eu, Tb, Ho, Er, Tm, Yb, Lu, and Y;

cooling the solution so as to form a temperature gradient zone where temperature is continuously falls from a top to bottom of the solution downwardly and cause the SiC single crystal to grow on the seed crystal; and adding powdery or granular Si or Si and SiC raw material which corresponds to variations in a composition of the solution to the solution from above the graphite crucible so as to keep the solution within a certain range of the composition while keeping the growth of the SiC single crystal, wherein the powdery or granular Si or Si and SiC raw material is added at the top of the solution having a higher temperature than the bottom of the solution, and an amount of the powdery or granular Si or Si and SiC raw material added to the solution is so controlled that a weight ratio $[W_R/(W_{Si}+W_R)]$ of the R to a sum of the weight $W_{Si}$, of Si and the weight $W_R$ of the R in the solution during growth of the SiC single crystal is within a range of 0.05 to 0.46.

16. The method of producing the SiC single crystal according to claim 15,
wherein the amount of the powdery or granular Si and/or SiC raw material added to the solution is so controlled that the difference between the weight ratio of the R in the solution during growth of the SiC single crystal and the weight ratio of the R in the composition of the raw material of the solution initially loaded in the graphite crucible does not exceed ±0.1.

17. The method of producing the SiC single crystal according to claim 15,
wherein a vacuum or an inert gas atmosphere is kept inside a furnace in which the graphite crucible is disposed, a temperature gradient zone in which temperature is continuously lowered along a downward direction is provided inside the furnace, and the graphite crucible is lowered within the temperature gradient zone so as to cause the SiC single crystal to grow on the seed crystal.

18. The method of producing the SiC single crystal according to claim 17,
wherein the temperature of the raw materials inside the crucible is 1,400 to 2,200° C., the temperature gradient zone is set to be 5 to 100° C./cm, and the lowering of the crucible is carried out at a rate of 10 to 1,000 μm/hr.

19. The method of producing the SiC single crystal according to claim 15,
wherein the weight ratio of C based on the whole part of the solution is controlled to within the range of 0.1 to 15% by weight.

20. The method of producing the SiC single crystal according to claim 15,
wherein an element Z selected from the group consisting of Ti, V, Cr, Mn, Fe, Co, Ni, Cu, Zn, Ge, Al, Zr, Nb, Mo, Hf, Ta, and W is added in addition to the R, the amount of Z being greater than 0% and not more than 0.5 times the amount of the R by weight.

21. The method of producing a SiC single crystal of claim 15, wherein the raw material added to the solution is Si.

22. The method of producing a SiC single crystal of claim 15, wherein the raw material added to the solution is Si and SiC, and a weight ratio of Si/SiC is 99.7/0.3 to 98/2.

23. The method of producing a SiC single crystal of claim 15, wherein the solution containing Si, C and the R caused inside the crucible has a temperature of 1,910 to 2,200° C.

24. A method of producing a SiC single crystal, comprising:
disposing a SiC seed crystal at a bottom part inside a graphite crucible;
causing a solution containing Si, C and R to be present in the graphite crucible, the R being at least one selected from the group consisting of La, Ce, Pr, Nd, Pm, Sm, Eu, Gd, Tb, Dy, Ho, Er, Tm, Yb, Lu, Sc and Y;
cooling the solution so as to form a temperature gradient zone where temperature is continuously falls from a top to bottom of the solution downwardly and cause the SiC single crystal to grow on the seed crystal; and
adding powdery or granular Si and SiC raw material which corresponds to variations in a composition of the solution to the solution from above the graphite crucible so as to keep the solution within a certain range of the composition while keeping the growth of the SiC single crystal,
wherein the powdery or granular Si and SiC raw material is added at the top of the solution having a higher temperature than the bottom of the solution, and amount of the powdery or granular Si and SiC raw material added to the solution is so controlled that a weight ratio $[W_R/(W_{Si}+W_R)]$ of the R to a sum of the weight $W_{Si}$ of Si and the weight $W_R$ of the R in the solution during growth of the SiC single crystal is within a range of 0.05 to 0.75, and a weight ratio of Si/SiC is 99.7/0.3 to 98/2.

25. The method of producing the SiC single crystal according to claim 24,
wherein the amount of the powdery or granular Si and/or SiC raw material added to the solution is so controlled that the difference between the weight ratio of the R in the solution during growth of the SiC single crystal and the weight ratio of the R in the composition of the raw material of the solution initially loaded in the graphite crucible does not exceed ±0.1.

26. The method of producing the SiC single crystal according to claim 24,
wherein a vacuum or an inert gas atmosphere is kept inside a furnace in which the graphite crucible is disposed, a temperature gradient zone in which temperature is continuously lowered along a downward direction is provided inside the furnace, and the graphite crucible is lowered within the temperature gradient zone so as to cause the SiC single crystal to grow on the seed crystal.

27. The method of producing the SiC single crystal according to claim 26,
wherein the temperature of the raw materials inside the crucible is 1,400 to 2,200° C., the temperature gradient zone is set to be 5 to 100° C./cm, and the lowering of the crucible is carried out at a rate of 10 to 1,000 μm/hr.

28. The method of producing the SiC single crystal according to claim 24,
wherein the weight ratio of C based on the whole part of the solution is controlled to within the range of 0.1 to 15% by weight.

29. The method of producing the SiC single crystal according to claim 24, wherein an element Z selected from the group consisting of Ti, V, Cr, Mn, Fe, Co, Ni, Cu, Zn, Ge, Al, Zr, Nb, Mo, Hf, Ta, and W is added in addition to the R, the amount of Z being greater than 0% and not more than 0.5 times the amount of the R by weight.

30. The method of producing a SiC single crystal of claim 24, wherein the solution containing Si, C and the R caused inside the crucible has a temperature of 1,910 to 2,200° C.

* * * * *